United States Patent
Butler et al.

(10) Patent No.: US 10,416,572 B2
(45) Date of Patent: Sep. 17, 2019

(54) POSITIONING SYSTEM, METHOD TO POSITION, LITHOGRAPHIC APPARATUS AND DEVICE MANUFACTURING METHOD

(71) Applicant: ASML NETHERLANDS B.V., Veldhoven (NL)

(72) Inventors: Hans Butler, Best (NL); Wim Symens, Leuven (BE); Bas Jansen, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/321,867

(22) PCT Filed: Jun. 29, 2017

(86) PCT No.: PCT/EP2017/066101
§ 371 (c)(1),
(2) Date: Jan. 30, 2019

(87) PCT Pub. No.: WO2018/024416
PCT Pub. Date: Feb. 8, 2018

(65) Prior Publication Data
US 2019/0179233 A1    Jun. 13, 2019

(30) Foreign Application Priority Data

Aug. 4, 2016    (EP) .................................... 16182808

(51) Int. Cl.
*G03F 7/20* (2006.01)
*H02N 2/06* (2006.01)

(52) U.S. Cl.
CPC ...... *G03F 7/70775* (2013.01); *G03F 7/70725* (2013.01); *G03F 7/70825* (2013.01); *H02N 2/062* (2013.01)

(58) Field of Classification Search
CPC .... G03F 7/70725; G03F 7/20; G03F 7/70516; G03F 7/70783; G03F 7/70777; G03F 7/70775

(Continued)

(56) References Cited

U.S. PATENT DOCUMENTS 8,610,332 B2 * 12/2013 Fleming ............... G01Q 10/065
                                                    310/317
2005/0198844 A1 * 9/2005 Lee ....................... H02N 2/0095
                                                    33/1 M (Continued)

FOREIGN PATENT DOCUMENTS

CN    105218092    1/2016
JP    H0193184    4/1989

(Continued)

OTHER PUBLICATIONS

International Search Report and Written Opinion issued in corresponding PCT Patent Application No. PCT/EP2017/066101, dated Sep. 1, 2017.

(Continued)

*Primary Examiner* — Hung Nguyen
(74) *Attorney, Agent, or Firm* — Pillsbury Winthrop Shaw Pittman LLP

(57) ABSTRACT

A positioning system including: a first body; a second body; and an actuator arranged between the first body and the second body to position the first body relative to the second body, wherein the actuator includes a first piezoelectric actuator and a second piezoelectric actuator arranged in series, wherein the first piezoelectric actuator has a first hysteresis, wherein the second piezoelectric actuator has a second hysteresis smaller than the first hysteresis, and wherein the second piezoelectric actuator has a positioning range at least equal to the first hysteresis.

20 Claims, 3 Drawing Sheets

(58) Field of Classification Search
USPC .................................................. 355/72–76
See application file for complete search history.

(56) References Cited

U.S. PATENT DOCUMENTS

| 2009/0251188 A1* | 10/2009 | Kim .................. H02M 3/073 327/291 |
| 2010/0320868 A1 | 12/2010 | Kushnir et al. |
| 2015/0092171 A1 | 4/2015 | Butler |

FOREIGN PATENT DOCUMENTS

| WO | 2010040185 | 4/2010 |
| WO | 2013160082 | 10/2013 |

OTHER PUBLICATIONS

"Interrogation techniques for fiber grating sensors and the theory of fiber gratings"; Lee, Byoungho, and Yoonchan Jeong; Fiber Optic Sensors [edited by Francis T.S. Yu and Shizhou Yin] (2002): pp. 295-381,.

Ito, Shingo, et al.: "Low-stiffness dual stage actuator for long rage positioning with nanometer resolution", Mechatronics 29, pp. 46-56, 2015.

Ito, Shingo, et al.: "Comparison of Fine Actuator Stiffness in Dual Stage Actuation for Vibration Isolation", American Society for Precision Engineering, 2013.

\* cited by examiner

POSITIONING SYSTEM, METHOD TO POSITION, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2017/066101, which was filed on Jun. 29, 2017, which claims the benefit of priority of European patent application no. 16182808.2, which was filed on Aug. 4, 2016, and which is incorporated herein its entirety by reference.

BACKGROUND

Field of the Invention

The present invention relates to a positioning system, a method to position, a lithographic apparatus and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatus usually comprise one or more objects or bodies that need to be positioned accurately. Examples thereof are the support for supporting the patterning device and the substrate table constructed to hold the substrate.

Actuators arranged to position the objects accurately need to have a relatively large moving range and at sub-nm resolution. Currently, low-stiffness Lorentz actuators are used for this purpose. A drawback of Lorentz actuators is the relatively large moving mass and the heat load.

SUMMARY

It is desirable to provide an actuator with a reduced moving mass and/or reduced heat load.

According to an embodiment of the invention, there is provided a positioning system comprising:
a first body;
a second body;
an actuator arranged between the first body and the second body to position the first body relative to the second body; and
wherein the actuator comprises a first piezoelectric actuator and a second piezoelectric actuator arranged in series,
wherein the first piezoelectric actuator has a first hysteresis,
wherein the second piezoelectric actuator has a second hysteresis smaller than the first hysteresis,
wherein the second piezoelectric actuator has a positioning range at least equal to the first hysteresis.

According to another embodiment of the invention, there is provided a method to position a first body relative to a second body with an actuator arranged between the first body and the second body,
wherein the actuator comprises a first piezoelectric actuator and a second piezoelectric actuator arranged in series,
wherein the first piezoelectric actuator has a first hysteresis,
wherein the second piezoelectric actuator has a second hysteresis smaller than the first hysteresis,
wherein the second piezoelectric actuator has a positioning range at least equal to the first hysteresis, and
wherein the method comprises the following steps:
a) driving the first piezoelectric actuator to position the first object relative to the second body;
b) driving the second piezoelectric actuator to compensate the hysteresis of the first piezoelectric actuator.

According to yet another embodiment of the invention, there is provided a lithographic apparatus comprising a positioning system according to the invention.

According to a further embodiment of the invention, there is provided a device manufacturing method wherein use is made of a positioning system according to the invention, a method according to the invention or a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
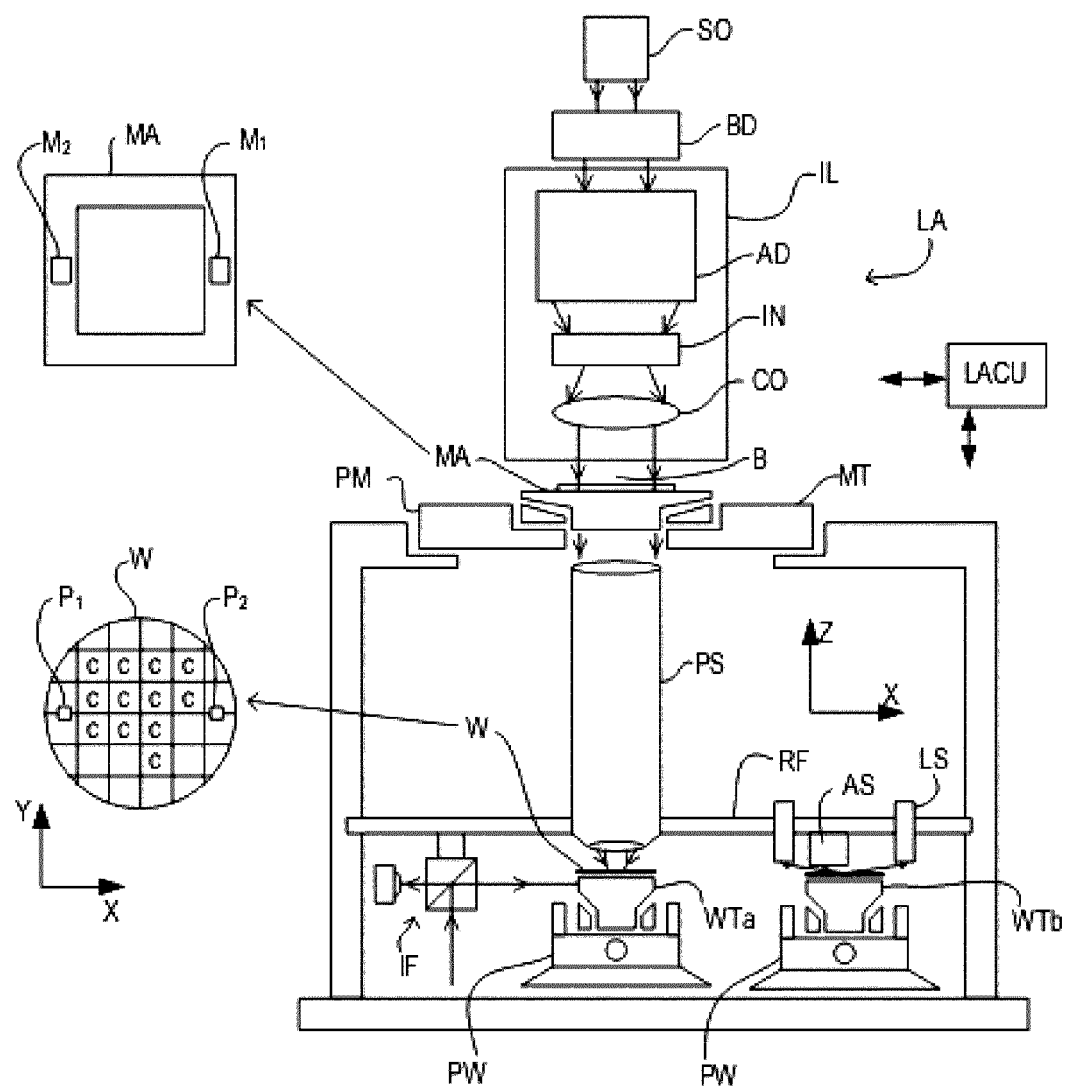
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or EUV radiation).
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses. An additional table may be arranged to hold at least one sensor, instead of holding a substrate W. The at least one sensor may be a sensor to measure a property of the projection system PS, a sensor to detect a position of a marker on the patterning device MA relative to the sensor or any other type of sensor. The additional table may comprise a cleaning device, for example for cleaning part of the projection system PS or any other part of the lithographic apparatus.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:
1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
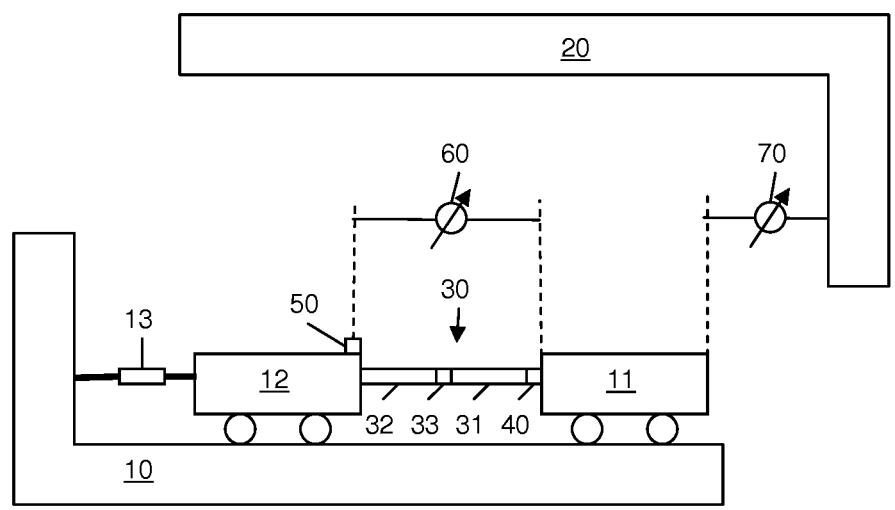
FIG. 2 depicts a positioning system according to an embodiment of the invention.

FIG. 2 depicts a positioning system according to an embodiment of the invention that is implemented in the lithographic apparatus of FIG. 1, e.g. to position the support structure MT for holding the patterning device MA or the substrate table WT constructed to hold a substrate W.

The positioning system comprises two moveable bodies, namely a first body 11 and a second body 12, that are moveable relative to a structure 10. The structure 10 can be a balance mass, a base frame, a support frame or any other frame.

The first body 11 is in this embodiment part of a short-stroke stage and the second body 12 is in this embodiment part of a long-stroke stage. A long-stroke actuator 13 is arranged between the structure 10 and the second body 12. This long-stroke actuator 13 allows for coarse positioning of the first and second bodies 11, 12 relative to a reference 20.

An actuator 30 is arranged between the first body 11 and the second body 12 to position the first body 11 relative to the second body 12. The actuator 30 comprises a first piezoelectric actuator 31 and a second piezoelectric actuator 32 connected to each other in series by a coupling element 33.

The first piezoelectric actuator 31 has a first hysteresis. The second piezoelectric actuator 32 has a second hysteresis smaller than the first hysteresis. The second piezoelectric actuator 32 has a positioning range at least equal to the first hysteresis. This provides the advantage that the second piezoelectric actuator 32 can be driven to compensate for the hysteresis of the first piezoelectric actuator thereby forming a substantially linear actuator while using a non-linear component.

In an embodiment, the first piezoelectric actuator 31 comprises a first piezoelectric material and the second piezoelectric actuator 32 comprises a second piezoelectric material different from the first piezoelectric material. The first piezoelectric material may have the first hysteresis. The second piezoelectric material may have the second hysteresis.

In an embodiment, the first piezoelectric actuator 31 comprises polycrystalline material, e.g. PZT material.

In an embodiment, the second piezoelectric actuator 32 comprises monocrystalline material, e.g. LiNBO3, quartz, PMN(-PT) and LiTaO3.

In an embodiment, the first piezoelectric actuator 31 comprises a soft-doped material, such as a soft-doped PZT material, resulting in large moving range per unit length of the soft-doped material, but with a relatively large first hysteresis. The second piezoelectric actuator 32 comprises a hard-doped material, such as a hard-doped PZT material, resulting in a small moving range per unit length of the hard-doped material, but with a small second hysteresis.

The length of the second piezoelectric actuator 32 may be larger than the length of the first piezoelectric actuator 31. This way, the second piezoelectric actuator 32 may comprise a piezoelectric material that has a small moving range per unit length of the piezoelectric material. By selecting a suitable length of the second piezoelectric actuator 32, the total moving range, i.e., the positioning range, of the second piezoelectric actuator 32 may be equal or larger than the first hysteresis.

The second piezoelectric actuator 32 preferably has a second hysteresis below 0.1%.

The positioning system may further comprise a force sensor 40, an acceleration sensor 50, a position sensor 60 and/or a position sensor 70. The force sensor 40 is to measure a force applied between the first body 11 and the second body 12 by the actuator 30. The acceleration sensor 50 is to measure the acceleration of the second body 12. The position sensor 60 is to measure the relative position between the first body 11 and the second body 12. The position sensor 70 is to measure the relative position of the first body 11 relative to the reference 20. In an embodiment, the positioning system only has one or more of the force sensor 40, the acceleration sensor 50, the position sensor 60 and the position sensor 70.

Figure 3:
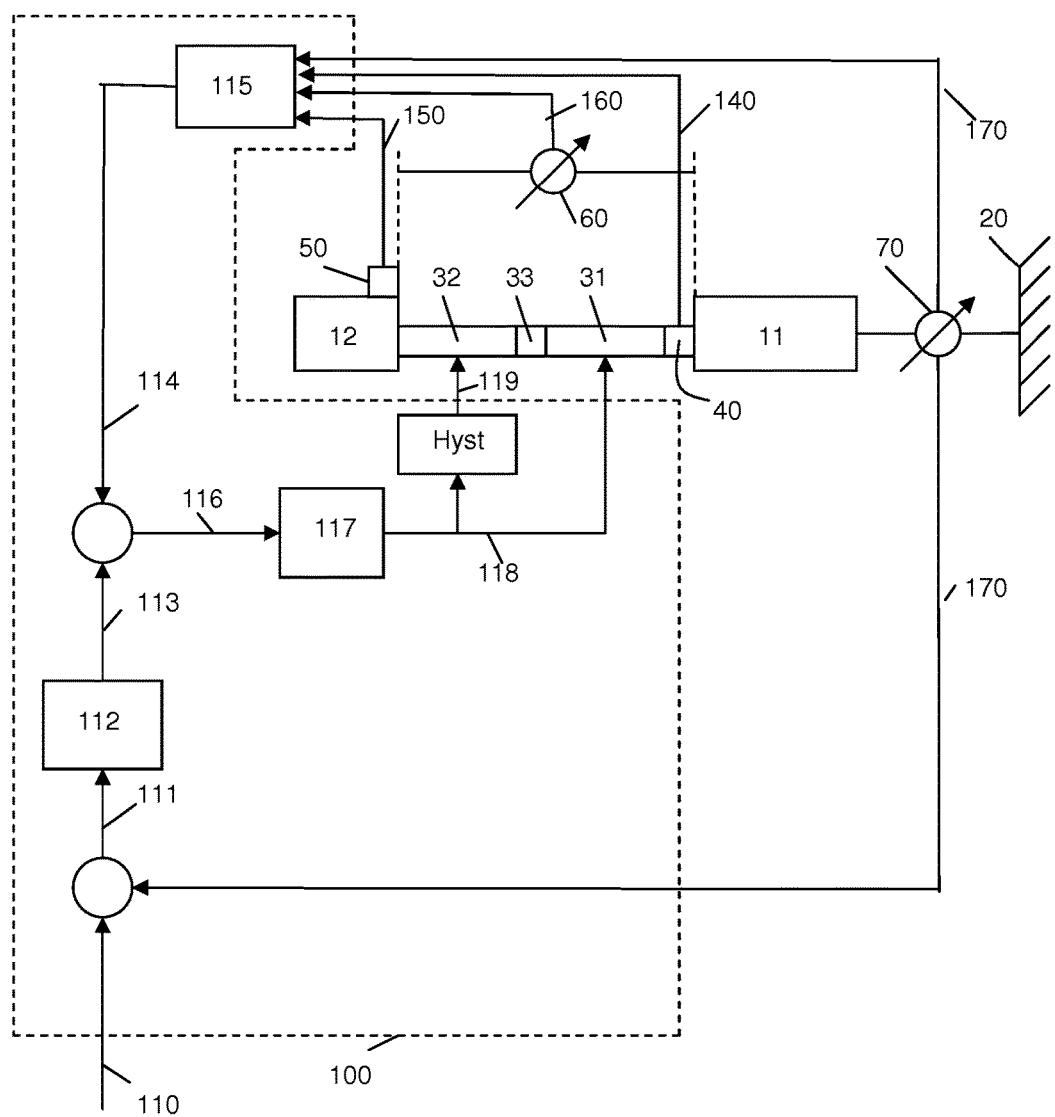
FIG. 3 depicts a control system to control the positioning system of FIG. 2.

The actuator 30 is driven by a control system 100, which control system 100 is schematically depicted in FIG. 3 along with the components to which the control system 100 may be connected.

Input to the control system 100 is a setpoint 110 for the desired position of the first body 11 relative to the reference 20. The desired position is compared with the actually measured position 170 of the first body 11 relative to the reference 20 as measured by position sensor 70. The difference 111 between the setpoint 110 and the measured position 170 is processed by a controller 112. Controller 112 outputs a desired force signal 113 for a desired actuator force to be applied by the actuator 30 to urge the first body 11 towards the desired position.

The desired force signal 113 in turn is compared with the actual force signal 114, which represents the actuator force applied by the actuator 30. To determine the actual force applied by the actuator 30, use can be made of the output 140 of the force sensor 40, the output 150 of the acceleration sensor 50, the output 160 of the position sensor 60 and/or the output 170 of the position sensor 70. The actual force signal 114 is in this embodiment generated by unit 115 based on at least one of output 140, output 150, output 160 and/or output 170. The unit 115 may generate the actual force signal 114 based on a directly measured actual force, e.g., by using the force sensor 40, or based on an indirectly measured actual force, e.g., by using the acceleration sensor 50, the position sensor 60 and/or the position sensor 70.

The difference 116 between the desired force signal 113 and the actual force signal 114 is input to unit 117 that calculates the drive signal 118 for the first piezoelectric actuator 31. Based on the drive signal 118 for the first piezoelectric actuator 31, the unit Hyst is able to determine the drive signal 119 for the second piezoelectric actuator 32 so as to compensate for the hysteresis of the first piezoelectric actuator 31.

In this way, a closed-loop position control is provided based on a difference between a desired position of the first body 11 and a measured position of the first body 11. The closed-loop position control includes a closed-loop force control based on a difference between a desired force determined by the closed-loop position control to be applied by the actuator 30 and a directly or indirectly measured force as applied by the actuator 30. As a result thereof, the stiffness of the connection of the actuator 30 between the first body 11 and the second body 12 is artificially reduced by appropriate control of the actuator 30.

Besides the already shown sensors, it is also possible to determine the actual force signal 114 by measuring the actual force applied by the actuator 30 using piezo-auto-sensing and/or the acceleration of the first object 11.

In an the embodiment, the second body 12 may be a stationary body, for example a body fixed to the structure 10 or a body fixed to the reference 20. Alternatively, a further movable body may be arranged between the structure 10 and the second body 12. The long-stroke actuator 13 is connected to the further movable body, so the long-stroke actuator 13 is arranged to move the second body 12 relative to the further movable body. The further movable body has a further actuator to move the further movable body relative to the structure 10. In this embodiment, the positioning system has a long-stroke stage, a medium-stroke stage and a short-stroke stage, wherein the long-stroke stage comprises the further movable body, wherein the medium-stroke stage comprises the second body 12 and wherein the short-stroke stage comprises the first body 11. The long-stroke stage may have a range of movement that allows the entire surface of the substrate W to move through the radiation beam exiting the projection system PS. The medium-stroke stage may have a range of movement that is smaller than the range of movement of the long-stroke stage, but sufficiently large to move a target portion C through the radiation beam exiting the projection system PS. The short-stroke stage may have a range of movement that is smaller than the range of movement of the medium-stroke stage, but sufficiently large to correct a position error of the medium-stroke stage.

The long-stroke actuator 13 may be a linear motor or a planar motor. The long-stroke actuator 13 may comprise a plurality of coils, which may be commutated according to a position of the second body 12.

The actuator 30 may be arranged to drive the first body 11 is a single direction, i.e., a first direction. In addition, the actuator 30 may be arranged to drive the first body 11 in multiple directions. For example, the first piezoelectric actuator 31 and the second piezoelectric actuator 32 may be supported by a further piezo actuator. The further actuator may be arranged to move the actuator 30 or the first body 11 in a second direction other than the first direction. In this embodiment, the actuator 30 and the further actuator are arranged in series. Alternatively, the further actuator is coupled to the first body 11 in parallel to the actuator 30. In this embodiment, the actuator 30 may comprise a flexible element that is flexible in the second direction to allow movement of the first body 11 in the second direction. The further actuator may be a piezo-type actuator, for example the same type of actuator as actuator 30. Alternatively, the further actuator is a different type of actuator, such as a Lorentz actuator. Hence, multiple actuators, of which at least one is an actuator 30 according to the invention, may be combined to position the first body in multiple directions, e.g. to form a 3DOF, 4DOF, 5DOF or 6DOF positioning system, wherein DOF stands for Degrees Of Freedom.

Instead of moving the first body 11 in the first direction, the actuator 30 may be arranged to rotate or tilt the first body 11. The first body 11 may be rotatable or tiltable relative to the second body 12.

In the embodiment of FIG. 2, the first piezoelectric actuator 31 is at one side of coupling element 33, and the second piezoelectric actuator 32 is at the other side of the coupling element 33. Alternatively, one or both of the piezoelectric actuator 31 and the piezoelectric actuator 32 are divided into a plurality of parts, which are arranged in series in any suitable way. For example, the second actuator 32 is divided into two parts, wherein the first actuator 31 is between the two parts, or vice versa.

Although the piezoelectric actuators are not described in more detail, it will be apparent for the skilled person that any known configuration, including stacking of piezoelectric material can be used.

Although not explicitly mentioned, it is also apparent for the skilled person that the invention applies to all operation modes of piezoelectric actuators, including but not limited to shear-mode, longitudinal mode, thickness mode, radial mode, etc. It is also possible that multiple modes are used in a single stack.

Although the first piezoelectric actuator 31 and the second piezoelectric actuator 32 have consistently been depicted as being connected to each other via a coupling element 33, it will be apparent for the skilled person that the coupling element 33 is an optional element. Further, coupling element 33 may simply be a adhesive layer.

In an embodiment, there is provided a positioning system comprising: a first body; a second body; an actuator arranged between the first body and the second body to position the first body relative to the second body, wherein the actuator comprises a first piezoelectric actuator and a second piezoelectric actuator arranged in series, wherein the first piezoelectric actuator has a first hysteresis, wherein the second piezoelectric actuator has a second hysteresis smaller than the first hysteresis, and wherein the second piezoelectric actuator has a positioning range at least equal to the first hysteresis.

In an embodiment, the first piezoelectric actuator comprises a first piezoelectric material and wherein the second piezoelectric actuator comprises a second piezoelectric material different from the first piezoelectric material. In an embodiment, the first piezoelectric material comprises polycrystalline material. In an embodiment, the first piezoelectric material comprises a hard doped material. In an embodiment, the second piezoelectric material comprises a monocrystalline material. In an embodiment, the second piezoelectric material comprises a soft doped material. In an embodiment, the second piezoelectric material comprises one or more of the following materials: $LiNBO_3$; quartz; PMN(-PT); $LiTaO_3$. In an embodiment, the positioning system comprises a control system to drive the actuator, wherein the control system is configured to drive the first piezoelectric actuator to position the first body and to drive the second piezoelectric actuator in order to compensate for the first hysteresis of the first piezoelectric actuator. In an embodiment, the positioning system comprises a short-stroke stage and a long-stroke stage, wherein the short-stroke stage comprises the first body, wherein the long-stroke stage comprises the second body, wherein the control system is configured to drive the actuator using a closed-loop position control based on a difference between a desired position of the short-stroke stage and a measured position of the short-stroke stage. In an embodiment, the closed-loop position control comprises a closed-loop force control based on a difference between a desired force determined by the closed-loop position control to be applied by the actuator to urge the short-stroke stage to the desired position and a directly or indirectly measured force as applied by the actuator. In an embodiment, the control system is configured to measure the force applied by the actuator by measuring one or more of the following parameters: a force between the long-stroke stage and the short-stroke stage as measured by a force sensor; a force between the long-stroke stage and the short-stroke stage reconstructed using piezo auto-sensing; a relative position between the long-stroke stage and the short-stroke stage; a long-stroke stage acceleration; a short-stroke stage acceleration; and/or a relative position measurement of the short-stroke stage or long-stroke stage relative to a reference.

In an embodiment, there is provided a method to position a first body relative to a second body with an actuator arranged between the first body and the second body, wherein the actuator comprises a first piezoelectric actuator and a second piezoelectric actuator arranged in series, wherein the first piezoelectric actuator has a first hysteresis, wherein the second piezoelectric actuator has a second hysteresis smaller than the first hysteresis, wherein the second piezoelectric actuator has a positioning range at least equal to the first hysteresis, and the method comprises the following steps: driving the first piezoelectric actuator to position the first object relative to the second body; and driving the second piezoelectric actuator to compensate the hysteresis of the first piezoelectric actuator.

In an embodiment, there is provided a lithographic apparatus comprising a positioning system as described herein.

In an embodiment, the lithographic apparatus further comprises: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the support or the substrate table is connected to the first body.

In an embodiment, there is provided a device manufacturing method wherein use is made of a positioning system as described herein, a method as described herein, or a lithographic apparatus as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning system comprising:
   a first body;
   a second body;
   an actuator arranged between the first body and the second body to position the first body relative to the second body,
   wherein the actuator comprises a first piezoelectric actuator and a second piezoelectric actuator arranged in series,
   wherein the first piezoelectric actuator has a first hysteresis,
   wherein the second piezoelectric actuator has a second hysteresis smaller than the first hysteresis, and
   wherein the second piezoelectric actuator has a positioning range at least equal to the first hysteresis.

2. The positioning system according to claim 1, wherein the first piezoelectric actuator comprises a first piezoelectric material and wherein the second piezoelectric actuator comprises a second piezoelectric material different from the first piezoelectric material.

3. The positioning system according to claim 2, wherein the first piezoelectric material comprises polycrystalline material.

4. The positioning system according to claim 2, wherein the first piezoelectric material comprises a soft doped material.

5. The positioning system according to claim 2, wherein the second piezoelectric material comprises a monocrystalline material.

6. The positioning system according to claim 2, wherein the second piezoelectric material comprises a hard doped material.

7. The positioning system according to claim 2, wherein the second piezoelectric material comprises one or more selected from:
   $LiNBO_3$;
   quartz;
   PMN(-PT); and/or
   $LiTaO_3$.

8. The positioning system according to claim 1, further comprising a control system to drive the actuator, wherein the control system is configured to drive the first piezoelectric actuator to position the first body and to drive the second piezoelectric actuator in order to compensate for the first hysteresis of the first piezoelectric actuator.

9. The positioning system according to claim 8, comprising a short-stroke stage and a long-stroke stage, wherein the short-stroke stage comprises the first body, wherein the long-stroke stage comprises the second body, and wherein the control system is configured to drive the actuator using a closed-loop position control based on a difference between a desired position of the short-stroke stage and a measured position of the short-stroke stage.

10. The positioning system according to claim 9, wherein the closed-loop position control is arranged to provide an actual force signal representing the actuator force applied by the actuator, and wherein the closed-loop position control comprises a closed-loop force control based on a difference between a desired force to be applied by the actuator to urge the short-stroke stage to the desired position and the actual force signal.

11. The positioning system according to claim 10, wherein the control system is configured to provide the actual force signal by measuring one or more selected from:
   i. a force between the long-stroke stage and the short-stroke stage as measured by a force sensor; and/or
   ii. a force between the long-stroke stage and the short-stroke stage reconstructed using piezo auto-sensing.

12. A method to position a first body relative to a second body with an actuator arranged between the first body and the second body, wherein the actuator comprises a first piezoelectric actuator and a second piezoelectric actuator arranged in series, wherein the first piezoelectric actuator has a first hysteresis, wherein the second piezoelectric actuator has a second hysteresis smaller than the first hysteresis, and wherein the second piezoelectric actuator has a positioning range at least equal to the first hysteresis, the method comprising:
   driving the first piezoelectric actuator to position the first body relative to the second body; and
   driving the second piezoelectric actuator to compensate the hysteresis of the first piezoelectric actuator.

13. A lithographic apparatus comprising the positioning system according to claim 1.

14. The lithographic apparatus according to claim 13, further comprising:
   a support constructed to support a patterning device, the patterning device being capable of imparting a radiation beam with a pattern in its cross-section to form a patterned radiation beam;
   a substrate table constructed to hold a substrate; and
   a projection system configured to project the patterned radiation beam onto a target portion of the substrate, wherein the support or the substrate table is connected to the first body.

15. A device manufacturing method comprising performing a device manufacturing process and performing the method according to claim 12.

16. The method according to claim 12, wherein the first piezoelectric actuator comprises a first piezoelectric material and wherein the second piezoelectric actuator comprises a second piezoelectric material different from the first piezoelectric material.

17. The method according to claim 12, wherein the first body is part of a short-stroke stage and the second body is part of a long-stroke stage and comprising driving the actuator using a closed-loop position control based on a difference between a desired position of the short-stroke stage and a measured position of the short-stroke stage.

18. The positioning system according to claim 10, wherein the control system is configured to provide the actual force signal by measuring a relative position between the long-stroke stage and the short-stroke stage or by measuring a relative position between the short-stroke stage or long-stroke stage and a reference.

19. The positioning system according to claim 10, wherein the control system is configured to provide the actual force signal by measuring a long-stroke stage acceleration and/or a short-stroke stage acceleration.

20. A non-transitory computer-readable medium comprising instructions therein, the instructions, upon execution by a computing system, are configured to cause the computing system to at least:
   drive a first piezoelectric actuator to position a first body relative to a second body, wherein an actuator arranged between the first body and the second body comprises the first piezoelectric actuator and a second piezoelectric actuator arranged in series with the first piezoelectric actuator, wherein the first piezoelectric actuator has a first hysteresis, wherein the second piezoelectric actuator has a second hysteresis smaller than the first hysteresis, and wherein the second piezoelectric actuator has a positioning range at least equal to the first hysteresis; and
   drive the second piezoelectric actuator to compensate the hysteresis of the first piezoelectric actuator.

* * * * *